United States Patent
Srinivasan et al.

(10) Patent No.: US 12,020,760 B2
(45) Date of Patent: *Jun. 25, 2024

(54) ATPG TESTING METHOD FOR LATCH BASED MEMORIES, FOR AREA REDUCTION

(71) Applicant: STMicroelectronics International N.V., Geneva (CH)

(72) Inventors: Venkata Narayanan Srinivasan, Greater Noida (IN); Balwinder Singh Soni, Faridabad (IN); Avneep Kumar Goyal, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

This patent is subject to a terminal disclaimer.

(21) Appl. No.: 18/078,714

(22) Filed: Dec. 9, 2022

(65) Prior Publication Data

US 2023/0105305 A1  Apr. 6, 2023

Related U.S. Application Data

(63) Continuation of application No. 17/443,556, filed on Jul. 27, 2021, now Pat. No. 11,557,364.

(51) Int. Cl.
*G11C 29/00*  (2006.01)
*G11C 7/10*  (2006.01)
(Continued)

(52) U.S. Cl.
CPC ............ *G11C 29/38* (2013.01); *G11C 7/1084* (2013.01); *G11C 7/22* (2013.01); *G11C 29/14* (2013.01); *G11C 29/36* (2013.01); *G11C 2029/1206* (2013.01); *G11C 2029/3602* (2013.01); *H03K 19/20* (2013.01)

(58) Field of Classification Search
CPC ............ G11C 29/10; G11C 2029/0401; G11C 2029/1208; G11C 2029/4402; G11C 2029/3602; G11C 7/22; G11C 7/1084; G11C 29/36; G11C 29/14; G11C 29/38; H03K 19/20
See application file for complete search history.

(56) References Cited

U.S. PATENT DOCUMENTS 6,154,202 A  11/2000 Hara et al.
6,732,223 B1 * 5/2004 Johnson ................ G06F 5/065
710/52

(Continued)

*Primary Examiner* — Esaw T Abraham
(74) *Attorney, Agent, or Firm* — Crowe & Dunlevy LLC (57) ABSTRACT

Disclosed herein is a method of operating a system in a test mode. When the test mode is an ATPG test mode, the method includes beginning stuck-at testing by setting a scan control signal to a logic one, setting a transition mode signal to a logic 0, and initializing FIFO buffer for ATPG test mode. The FIFO buffer is initialized for ATPG test mode by setting a scan reset signal to a logic 0 to place a write data register and a read data register associated with the FIFO buffer into a reset state, enabling latches of the FIFO buffer using an external enable signal, removing the external enable signal to cause the latches to latch, and setting the scan reset signal to a logic 1 to release the write data register and the read data register from the reset state, while not clocking the write data register.

20 Claims, 7 Drawing Sheets

(51) Int. Cl.
*G11C 7/22* (2006.01)
*G11C 29/14* (2006.01)
*G11C 29/36* (2006.01)
*G11C 29/38* (2006.01)
G11C 29/12 (2006.01)
H03K 19/20 (2006.01)

(56) References Cited

U.S. PATENT DOCUMENTS

| | | | | |
|---|---|---|---|---|
| 7,149,139 | B1 * | 12/2006 | Rosen | G06F 5/16 |
| | | | | 365/233.17 |
| 7,209,983 | B2 * | 4/2007 | Au | G06F 12/0893 |
| | | | | 711/170 |
| 7,447,109 | B2 * | 11/2008 | Takano | G11C 5/066 |
| | | | | 365/233.13 |
| 8,321,713 | B2 * | 11/2012 | Nobunaga | G11C 7/22 |
| | | | | 713/502 |
| 8,775,701 | B1 * | 7/2014 | Fung | G06F 1/12 |
| | | | | 375/372 |
| 8,954,622 | B1 | 2/2015 | Wang | |
| 9,529,044 | B1 * | 12/2016 | Taneja | G01R 31/318547 |
| 10,060,971 | B2 * | 8/2018 | Douskey | G01R 31/318541 |
| 10,502,784 | B2 | 12/2019 | Srinivasan et al. | |

* cited by examiner

ATPG TESTING METHOD FOR LATCH BASED MEMORIES, FOR AREA REDUCTION

RELATED APPLICATION

This application is a continuation of U.S. patent application Ser. No. 17/443,556, filed Jul. 27, 2021 (now U.S. Pat. No. 11,557,364, issued Jan. 17, 2023), the content of which is incorporated by reference in its entirety to the maximum extent allowable under the law.

TECHNICAL FIELD

This disclosure is related to the field of integrated circuit devices and, in particular, concerns circuits and techniques to facilitate the operation of first-in-first-out (FIFO) buffers constructed from latches in test modes in a way that permits complete testing of the write/read path of those FIFO buffers.

BACKGROUND

Integrated circuit devices, such as systems on a chip (SOCs) and microcontrollers, are ever increasing in complexity, with new and advanced features being introduced regularly. As a result, the area on such devices consumed by digital logic has increased, which is undesirable as it increases costs. Therefore, attempts at reducing such area consumption have been made.

One area of focus has been to reduce the area of data first-in first-out (FIFO) buffers utilized in SOCs and microcontrollers. A FIFO buffer is conventionally formed by flip flops. Some efforts in area reduction have focused on replacing the flip flops of data FIFO buffers with latches, since this may reduce the physical area consumed by such FIFO buffers by 45% to 50%. This, however, leads to issues with the ability to test the FIFO buffer fully.

Figure 1:
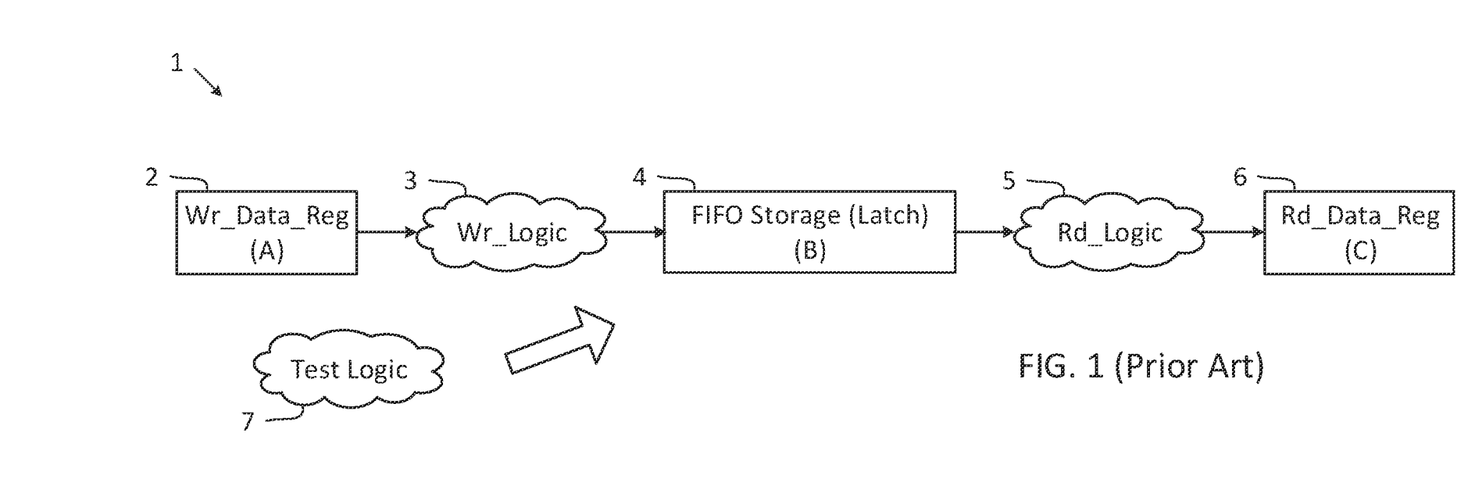
FIG. 1 is a high level block diagram of a prior art FIFO buffer, circuitry associated with its operation, and circuitry associated with its testing.

A FIFO buffer 4 formed by latches, and its associated logic circuitry, is shown as reference 1 in FIG. 1. Here, data to be written to the FIFO buffer 4 is first written to a write data register 2, and is then passed appropriately through and by write logic circuitry 3 to the FIFO buffer 4 to perform the write. Data to be read from the FIFO buffer 4 is passed appropriately through and by read logic circuitry 5 to a read data register 6. Of note is that the write data register 2 and read data register 6 are part of a scan chain used in test modes. Test logic 7 operates upon the FIFO buffer 4, the write data register 2 part of the scan chain, write logic circuitry 3, FIFO buffer 4, read logic circuitry 5, and the read data register 6 part of scan chain so as to perform testing upon the FIFO buffer 4, such as using known techniques like Automatic Test Pattern Generation (ATPG) testing and Logic Built in Self Test (LBIST) testing.

In order to test the FIFO buffer 4 using ATPG testing and LBIST testing, the latches within the FIFO buffer 4 are, at appropriate times during the course of testing, made transparent by application of an asserted enable signal to their enable pins caused by the test logic 7, enabling the test of proper passage of data from the write data register 2 through the FIFO buffer 4 to the read data register 6, and enabling the test of the FIFO buffer 4 for stuck-at-0 faults on their latch enable pins. This testing capability, though, is more limited than would be desired—only the entire data path from the write data register 2 through the FIFO buffer 4 to the read data register 6 as a whole can be tested, meaning there is no ability to individually test the data path from the write data register 2 to the FIFO buffer 4 and to individually test the data path from the FIFO buffer 4 to the read data register 6. Also, there is no ability to test the FIFO buffer 4 for stuck-at-1 faults on their latch enable pins.

As such, further development into the area of FIFO buffers utilizing latches as their storage elements is desired so as to enable a larger range of testing to be performed on those FIFO buffers.

SUMMARY

Disclosed herein is a system including: a write data register configured to store data to be written; a read data register configured to store data read thereinto; a first-in-first-out (FIFO) buffer comprised of banks of latches, and the banks of latches being arranged to store multiple words, with one word at a time being selectable by a write address signal for having the data from the write data register written thereinto, and with one word at a time being selectable by a read address signal for having data stored therein read out into the read data register; control circuitry configured to receive a read request signal and the read address signal, and to generate a read enable signal; and glue logic configured to generate an internal write enable signal from at least a write enable signal and to generate an internal read enable signal from at least the read enable signal. When the system is in a functional mode, the banks of latches of the FIFO buffer are enabled by the write enable signal and the read enable signal. When the system is in a test mode, the banks of latches of the FIFO buffer are enabled by the internal write enable signal and the internal read enable signal.

The control circuitry and glue logic may cooperate to operate the system in the test mode when the test mode is an automated test pattern generation (ATPG) test mode by: beginning stuck-at testing; and performing a test setup phase to initialize the FIFO buffer for ATPG test mode. The test setup phase is performed by setting a scan reset signal to a logic 0 to thereby place the write data register and the read data register into a reset state; enabling the banks of latches of the FIFO buffer using an external enable signal to thereby make the banks of latches transparent; removing the external enable signal to thereby cause the banks of latches to latch; and setting the scan reset signal to a logic 1 to thereby release the write data register and the read data register from the reset state, while not supplying a clock signal to the write data register, thereby completing the test setup phase.

The control circuitry and glue logic may further cooperate to operate the system in the test mode when the test mode is the ATPG test mode by: performing a shift phase by shifting an ATPG test pattern into the FIFO buffer such that, after a last shift, the write data register holds a value of a last bit to be shifted in; and performing a capture phase, wherein, when the FIFO buffer is experiencing a stuck-at-1 fault at an enable input of one or more of the banks of latches, the read data register holds the value of the last bit to be shifted in, but when the FIFO buffer is not experiencing the stuck-at-1 fault at the enable input of one or more of the banks of latches, the read data register holds a logic 0.

The control circuitry and glue logic may cooperate to operate the system in the test mode when the test mode is a logic built in self test (LBIST) mode by: enabling the banks of latches of the FIFO buffer using an enable signal to thereby cause the banks of latches to become transparent; generating a LBIST pattern and passing the LBIST pattern through the FIFO buffer; and after a given number of bits of the LBIST pattern have passed through the FIFO buffer, deasserting the enable signal.

The control circuitry and glue logic may cooperate to operate the system in the test mode when the test mode is a logic built in self test (LBIST) mode by: enabling the banks of latches of the FIFO buffer using an enable signal; generating a LBIST pattern and passing the LBIST pattern through the FIFO buffer; and after a given number of bits of the LBIST pattern have passed through the FIFO buffer, deasserting the enable signal.

The write data register and read data register may be clocked by a clock signal. When the control circuitry and glue logic cooperate to operate the system in the test mode when the test mode is an automated test pattern generation (ATPG) mode, the clock signal may be supplied by a phase locked loop. When the control circuitry and glue logic cooperate to operate the system in the test mode when the test mode is an automated test pattern generation (ATPG) mode, the clock signal may be externally supplied.

Also disclosed herein is a system including: a write data register clocked by a clock signal; a read data register clocked by the clock signal; a first-in-first-out (FIFO) buffer coupled between the write data register and read data register, the first FIFO buffer comprised of banks of latches that are enabled by a read enable signal and a write enable signal, accessed for reading by a read address signal, and accessed for writing by a write address signal; and glue logic configured to generate an internal write enable signal from at least the write enable signal and to generate an internal read enable signal from at least the read enable signal.

The glue logic may include a first glue logic circuit, the first glue logic circuit having: a first flip flop having a data input receiving a scan enable signal, an output, and a clock input receiving the clock signal; a second flip flop having a data input receiving the output of the first flip flop, an output at which an internal scan enable signal is generated, and a clock input receiving the clock signal; and an AND gate having a first inverting input receiving the scan enable signal, a second inverting input receiving the output of the first flip flop, and a third non-inverting input receiving the internal scan enable signal, wherein the AND gate generates a gated scan enable signal at its output.

The glue logic may include a second glue logic circuit, the second glue logic circuit having: an AND gate having a first input receiving a write request signal and a second input receiving a gated scan enable signal, and having an output; a first multiplexer having a first data input receiving a pad enable signal, a second data input receiving the output of the AND gate, a selection input receiving a transition mode signal, and an output; and a second multiplexer having a first data input receiving the write request signal, a second data input receiving the output of the first multiplexer, a selection input receiving a scan control signal, and an output at which the internal write enable signal is generated.

The glue logic may include a third glue logic circuit, the third glue logic circuit having: an AND gate having a first non-inverting input receiving a read valid signal, a second inverting input receiving an internal scan enable signal, a third inverting input receiving the scan enable signal, and an output; and a multiplexer having a first data input receiving the read valid signal, a second data input receiving the output of the AND gate of the third glue logic circuit, a selection input receiving a transition mode signal, and an output at which an internal read valid signal is generated.

The glue logic may include a fourth glue logic circuit, the fourth glue logic circuit having: an AND gate having a first non-inverting input receiving the read enable signal, a second inverting input receiving an internal scan enable signal, a third inverting input receiving the scan enable signal, and an output; and a multiplexer having a first data input receiving the read enable signal, a second data input receiving the output of the AND gate of the fourth glue logic circuit, a selection input receiving a transition mode signal, and an output at which the internal read enable signal is generated.

The glue logic may include a fifth glue logic circuit, the fifth glue logic circuit having: a first AND gate having a first input receiving a write request signal, a second input receiving a pad enable signal, and an output; a second AND gate having a first non-inverting input receiving a transition mode signal, a second inverting input receiving a scan enable signal, and an output; a first multiplexer having a first data input receiving the pad enable signal, a second data input receiving the output of the first AND gate, a selection input receiving the output of the second AND gate, and an output; and a second multiplexer having a first data input receiving the write request signal, a second data input receiving the output of the first multiplexer, a selection input receiving a scan control signal, and an output at which the internal write enable signal is generated.

The glue logic may include a sixth logic circuit, the sixth logic circuit having: a first AND gate having a first non-inverting input receiving a read valid signal, a second inverting input receiving a pad enable signal, and an output; a second AND gate having a first non-inverting input receiving a transition mode signal, a second inverting input receiving a scan enable signal, and an output; and a multiplexer having a first data input receiving the read valid signal, a second data input receiving the output from the first AND gate, a selection input receiving the output of the second AND gate, and an output at which an internal read valid signal is generated.

The glue logic may include a seventh logic circuit, the seventh logic circuit having: a first AND gate having a first non-inverting input receiving a read enable signal, a second inverting input receiving a pad enable signal, and an output; a second AND gate having a first non-inverting input receiving a transition mode signal, a second inverting input receiving a scan enable signal, and an output; and a multiplexer having a first data input receiving the read enable signal, a second data input receiving the output from the first AND gate of the seventh logic circuit, a selection input receiving the output of the second AND gate of the seventh logic circuit, and an output at which the internal read enable signal is generated.

Also disclosed herein is a method of operating a system in a test mode, the method including, when the test mode is an automated test pattern generation (ATPG) test mode: beginning stuck-at testing by setting a scan control signal to a logic one and setting a transition mode signal to a logic 0; and initializing a first-in-first-out (FIFO) buffer for ATPG test mode. The FIFO buffer is initialized by: setting a scan reset signal to a logic 0 to thereby place a write data register and a read data register associated with the FIFO buffer into a reset state; enabling latches of the FIFO buffer using an external enable signal; removing the external enable signal to thereby cause the latches to latch; and setting the scan reset signal to a logic 1 to thereby release the write data register and the read data register from the reset state, while not clocking the write data register.

The method may further include, when the test mode is the ATPG test mode: performing a shift phase by shifting an ATPG test pattern into the FIFO buffer such that, after a last shift, the write data register holds a value of a last bit to be shifted in; and performing a capture phase, wherein, when the FIFO buffer is experiencing a stuck-at-1 fault at an enable input of one or more of the latches, the read data register holds the value of the last bit to be shifted in, but when the FIFO buffer is not experiencing the stuck-at-1 fault at the enable input of one or more of the latches, the read data register holds a logic 0.

When the FIFO buffer is experiencing a stuck-at-1 fault at an enable input of one or more of the latches, the FIFO buffer may contain the value of the last bit to be shifted in, but when the FIFO buffer is not experiencing the stuck-at-1 fault at the enable input of one or more of the latches, the FIFO buffer at this point might not contain the value of the last bit to be shifted in.

When the test mode is a logic built in self test (LBIST) mode, the method may include: enabling the latches of the FIFO buffer using an enable signal to thereby cause the latches to become transparent; and generating a LBIST pattern and passing the LBIST pattern through the FIFO buffer.

After a given number of bits of the LBIST pattern have passed through the FIFO buffer, the method may include deasserting the enable signal such that, when the FIFO buffer is experiencing a stuck-at-1 fault at an enable input of one or more of the latches, the FIFO buffer continues to pass the LBIST pattern, but when the FIFO buffer is not experiencing the stuck-at-1 fault at an enable input of one or more of the latches, the method may include the FIFO buffer ceasing to pass the LBIST pattern.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 2:
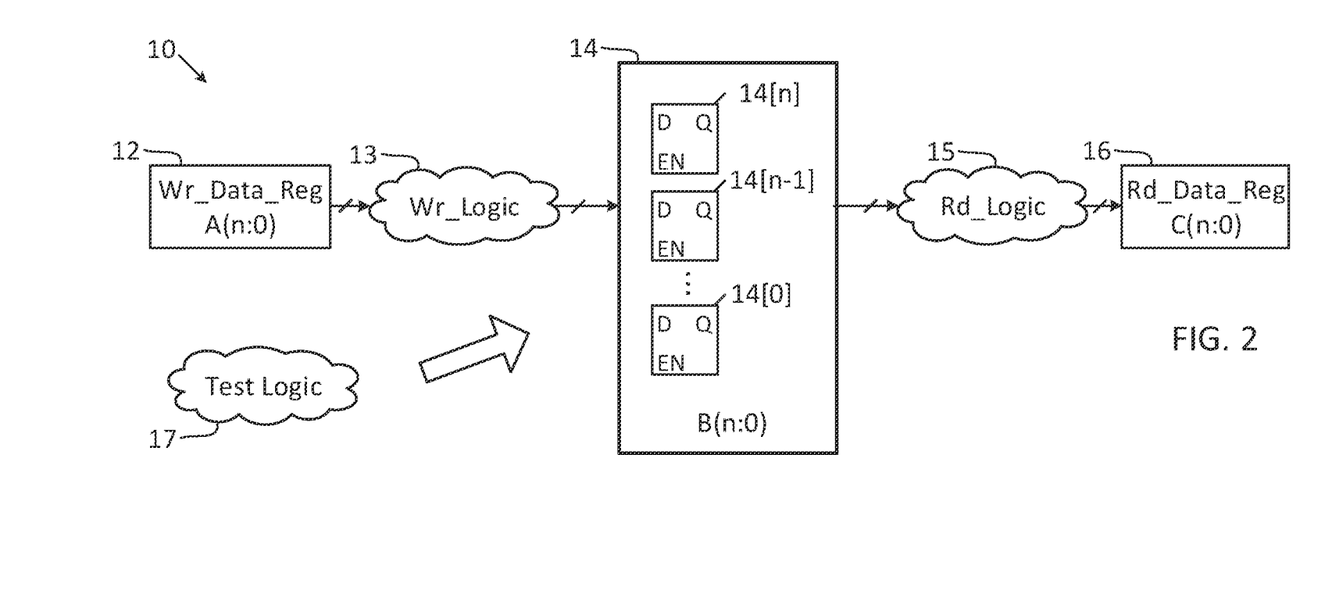
FIG. 2 is a high level block diagram of a FIFO buffer, circuitry associated with its operation, and circuitry associated with its testing, as described herein.

Illustrated in FIG. 2 is a FIFO buffer 14, such as that used in a SOC or microcontroller. The FIFO buffer 14 is comprised of a bank of latches (illustrated here as the n D-latches 14[0], . . . 14[n]) that receive data from a write data register 12 and output data to a read data register 16. Write logic circuitry 13 passes the data from the write data register 12 to all the latches in the FIFO buffer 14, and read logic circuitry 15 receives the data from all the latch in the FIFO buffer and passes it to the read data register 16. The latches of the FIFO buffer 14 are enabled by an enable signal.

Test logic 17 operates upon the FIFO buffer 14, write data register 12 part of the scan chain, write logic circuitry 13, FIFO buffer 14 and read logic circuitry 15, and read data register 16 part of the scan chain so as to perform testing upon the FIFO buffer 14, such as using known techniques like Automatic Test Pattern Generation (ATPG) testing and Logic Built in Self Test (LBIST) testing. The write data register 12 and read data register 16 present as part of the scan chain are used during testing to shift in the data to be written into FIFO buffer 14 and shift out the read data from FIFO buffer 14 respectively. Note that a write pointer register Wr_Ptr, read pointer register Rd_Ptr, and control registers receiving a write request signal Wr_Req a read request signal Rd_Req, described below, are also present as part of the scan chain, and are used to select the latches to be written to in the FIFO buffer 14 and to select the latches to be read from the FIFO buffer 14.

Operation so as to enable ATPG testing of the FIFO buffer 14 that can test both data paths (from the write data register 12 to the FIFO buffer 14, shown as data path A to B; and from the FIFO buffer 14 to the read data register 16, shown as data path B to C) as well stuck-at-1 faults on their latch enable pins is now described with additional reference to Table 1 (illustrated below).

TABLE 1

| ATPG Mode | SCAN CTRL | SCAN RESET | EN | A out | B out | C out | B out | C out |
|---|---|---|---|---|---|---|---|---|
| | | | | | | | NO SA1 FAULT ON EN OF B | | SA1 FAULT ON EN OF B | |
| Test | 1 | 0 | 1 | 0 | 0 | 0 | 0 | 0 |
| Setup | 1 | 0 | 0 | 0 | 0 | 0 | 0 | 0 |
| | 1 | 1 | 0 | 0 | 0 | 0 | 0 | 0 |
| After last shift | 1 | 1 | 0 | as | 0 | cs | as | cs |
| Capture | 1 | 1 | 0 | ac | 0 | 0 | ac | as |

Testing begins by setting a scan control signal to a logic 1 and a transition mode signal Transition_Mode to a logic 0 to indicate that stuck-at testing is to be performed, and then entering a Test Setup phase which initializes the FIFO buffer 14 and its associated circuitry for ATPG mode.

At the beginning of the Test Setup phase, a scan reset signal is set to a logic 0 (for example, via application of a signal by external test equipment to a pad or pin) to thereby place the write data register 12 and the read data register 16 into reset, forcing their contents to a logic 0 (the contents of the write data register 12 are shown as "A out" and the contents of the read data register 16 are shown as "C out" in Table 1). Then the enable signal at the enable inputs of the latches of the FIFO buffer 14 (shown as "EN" in Table 1) is asserted via application of a signal by external test equipment to a pad or pin, making those latches transparent.

In a non-fault case (where none of the latches are experiencing a stuck-at-1 fault at their enable pins), since the latches are transparent, the output of the FIFO buffer 14 (shown as "B out" in Table 1) will therefore be a logic 0, and the read data register 16 will store a logic 0 as the scan reset signal is set to a logic 0. In a fault case (where one or more of the latches are experiencing a stuck-at-1 fault at their enable pins), the corresponding latch or corresponding latches output from the FIFO buffer 14 will remain at a logic 0, and the read data register 16 will continue to store a logic 0 as the scan reset signal is set to a logic 0.

Next, while still remaining in the Test Setup phase, the enable signal at the enable inputs of the latches of the FIFO buffer 14 is deasserted, causing the latches to latch. Therefore, in a non-fault case (where none of the latches are experiencing a stuck-at-1 fault at their enable pins), since those latches were previously outputting a logic 0, it is expected that they will continue to do so. As such, it is expected that the output from the FIFO buffer 14 will be a logic 0, and the output of the read data register 16 remains at logic 0 as the scan reset signal is set to a logic 0. In a fault case (where one or more of the latches is experiencing a stuck-at-1 fault at their enable pins), due to the write data register 12 continuing to store a logic 0, the corresponding latch or corresponding latches output from the FIFO buffer 14 will continue to be a logic 0.

Next, the scan reset signal is set to a logic 1, releasing the write data register 12 and read data register 16 from their reset state. However, there are no clock pulses supplied to the write data register 12 yet, so the contents of the write data register 12 remain at a logic 0.

In a non-fault cause (where none of the latches are experiencing at a stuck-at-1 fault at their enable pins), the output of the FIFO buffer 14 will remain at a logic 0 due to the enable signal for its latches remaining at 0, and the contents of the read data register 16 remain at a logic 0 as there are no clock pulses supplied to the read data register 16 yet. In a fault case (where one or more of the latches are experiencing a stuck-at-1 fault at their enable pins), since the contents of the write data register 12 are still at a logic 0, it is expected that the corresponding latch or corresponding latches output from the FIFO buffer 14 will remain at a logic 0, and the contents of the read data register 16 remain at a logic 0 as there are no clock pulses supplied to the read data register 16 yet.

The Test Setup phase is complete at this point, and shifting in of the ATPG test pattern through the scan chain to the FIFO buffer 14 occurs in the shift phase. As shown, after the last shift, the write data register 12 holds the value of the last bit to be shifted in, labeled by "as" in Table 1.

Since the enable signal to the FIFO buffer 14 will be at a logic 0 at this point, in a non-fault case (where none of the latches are experiencing at a stuck-at-1 fault at their enable pins), the value "as" (which can be either a logic 0 or a logic 1) from the write data register 12 has not yet been latched to the output of the FIFO buffer 14, and the read data register 16 holds the value of the last bit to be shifted in "cs" (which can also be a logic 0 or a logic 1). In a fault case (where one or more of the latches of the FIFO buffer 14 is experiencing a stuck-at-1 fault at its enable input), the corresponding latch or corresponding latches of the FIFO buffer 14 have been made transparent and therefore the output from the corresponding latch or corresponding latches of FIFO buffer 14 is the value "as", and the read data register 16 holds the value of the last bit to be shifted in "cs".

Since the last shift has been performed, the capture phase begins. During the capture phase, the scan chain is no longer formed, and the values captured are from functional paths (non-scan paths). Since the enable signal to the FIFO buffer 14 will be at a logic 0 at this point, in a non-fault case (where none of the latches of the FIFO buffer 14 are experiencing at a stuck-at-1 fault at their enable inputs), the value "ac" (which can be either a logic 0 or a logic 1) from the write data register 12 has not yet been latched to the output of the FIFO buffer 14, and therefore the read data register 16 captures the value "0". In fault case (where one or more of the latches of the FIFO buffer 14 is experiencing a stuck-at-1 fault at its enable input), the corresponding latch or corresponding latches of the FIFO buffer 14 have been made transparent and therefore the output captured in the corresponding latch or corresponding latches of FIFO buffer 14 is the value "ac", while the read data register 16 captures the FIFO buffer 14 value at the end of last shift which is "as" for the latches having stuck-at-1 faults at their enable input. This will create a mismatch at the next shift when the read data register 16 contents are shifted out as part of scan chain.

Operation so as to enable LBIST testing of the FIFO buffer 14 is now described. Initially, the enable input of the FIFO buffer 14 is asserted, causing the latches to become transparent, and the LBIST pattern is internally generated. After a given number of bits have been fed through the FIFO buffer 14, the enable input of the FIFO is deasserted. In the non-fault case (where the FIFO buffer 14 is not experiencing a stuck-at-1 fault at its enable input), then the read data register 16 captures the output of the FIFO buffer 14 at the time the enable input was deasserted. Therefore, when a signature is generated from the data written to the read data register 16 and compared to a known fault free signature for the given number of bits, there will not be a mismatch.

However, in a fault case (where one or more latches of the FIFO buffer 14 is experiencing a stuck-at-1 fault at its input), the corresponding latch or corresponding latches of the FIFO buffer 14 stays transparent, capturing different values from the write data register 12 as the LBIST pattern continues. Therefore, when the signature is generated from the data written to the read data register 16 and compared to a known fault free signature for the given number of bits, there will be a mismatch, indicating the presence of the stuck-at-1 fault on the enable input of the FIFO buffer 14.

Figure 3:
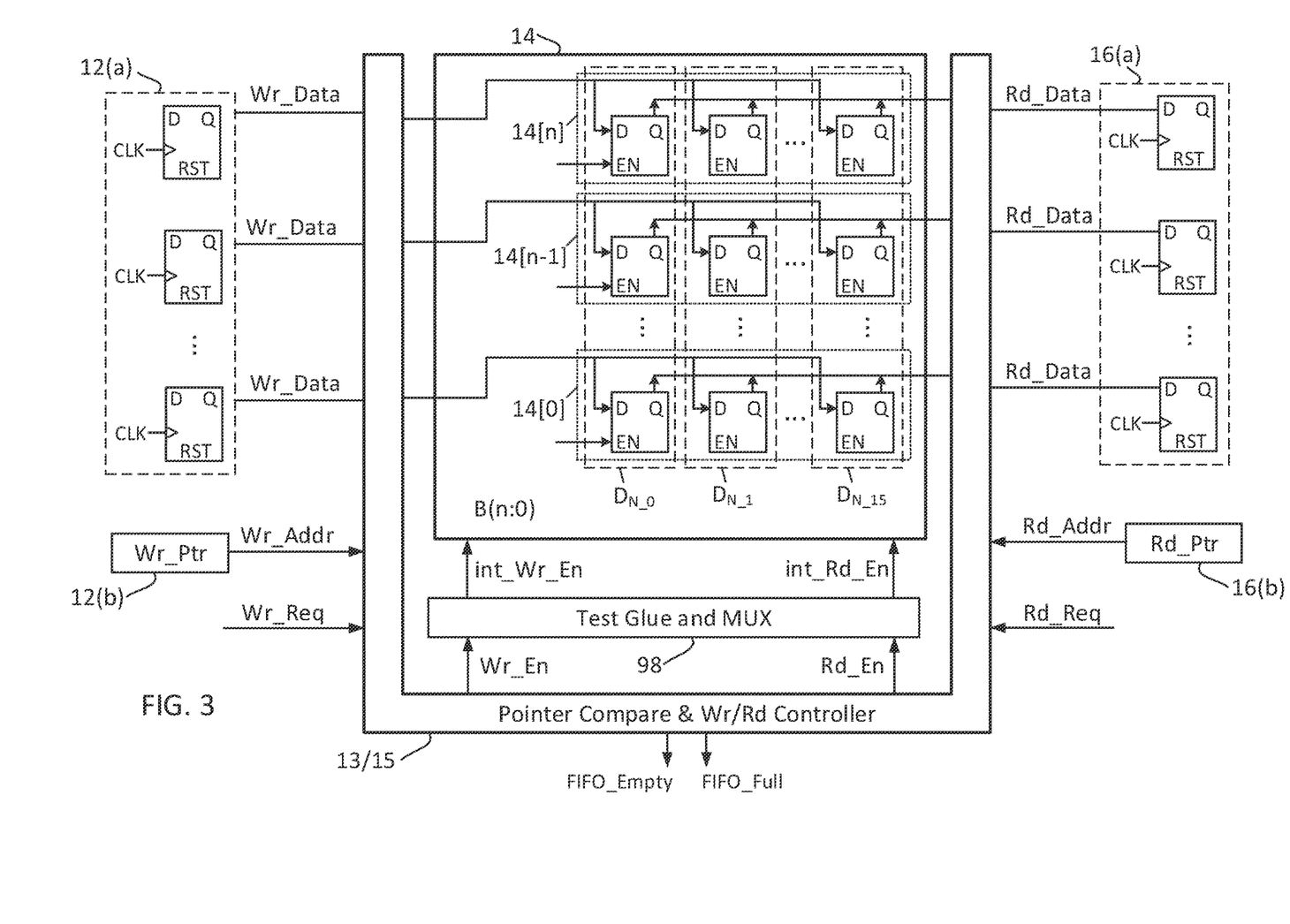
FIG. 3 is a more detailed block diagram of the FIFO buffer of FIG. 2 and the circuitry associated with its operation.

Details of the write data register 12, write logic 13, FIFO buffer 14, read logic 15, and read data register 16 may be found in FIG. 3. In this example shown, the FIFO buffer 14 is comprised of sixteen bank of latches, labeled as $D_{N-0}$ to $D_{N-15}$ where $D_{N-0}$ is n:0, similarly $D_{N-1}$ is n:0, $D_{N-2}$ is n:0, ..., $D_{N-15}$ is n:0, with n being one less than the bit width of the FIFO buffer 14, for example 31. The write logic 13 and read logic 15 are contained within a read/write controller. The write data register 12 stores data 12(*a*) to be written to the FIFO buffer 14, labeled as Wr_Data, and write pointer 12(*b*) is another register indicating the address Wr_Addr within the FIFO buffer 14 where the data 12(*a*) is to be written. The read data register 16 stores data 16(*a*) read from the FIFO buffer 14, labeled as Rd_Data, based on the value from read pointer 16(*b*), a register indicating the address Rd_Addr where the data 16(*a*) is to be read. The write/read controller 13/15 is operable to receive a write request signal Wr_Req and a read request signal Rd_Req, which respectively indicate when a write to the FIFO buffer 14 with data 12(*a*) from the write data register 12 is requested and when a read from the FIFO buffer 14 of the data 16(*a*) to the read data register 16 is requested. The write/read controller 13/15 is also operable to receive the write data pointer 12(*b*) and read data pointer 16(b) from the write pointer register 12(b) and read pointer register 16(b), and to generate a FIFO_Empty signal indicating when the FIFO buffer 14 is not full and a FIFO_Full signal indicating when the FIFO buffer 14 is full. Based on the FIFO_Empty signal and the FIFO_Full signal, and the write request Wr_Req and read request Rd_Req, the write/read controller 13/15 generates a write enable signal Wr_En (which is a buffered version of the write request signal Wr_Req and serves as the enable signal to the bank of latches of the FIFO buffer 14 and to facilitate the writing of data into the latch bank [$D_{N\text{-}0}$ or $D_{N\text{-}1}$ or $D_{N\text{-}2}$, ..., or $D_{N\text{-}15}$] selected with Wr_Addr) and a read enable signal Rd_En (which is a buffered version of the read request signal Rd_Req) at appropriate times so as to facilitate the reading of data out of the latch bank[$D_{N\text{-}0}$ or $D_{N\text{-}1}$ or $D_{N\text{-}2}$, ..., or $D_{N\text{-}15}$] within FIFO buffer 14 selected with Rd_Addr.

In particular, when the FIFO buffer 14 is not full, the FIFO buffer 14 has one or more latches that is not storing a current data bit. When the FIFO buffer 14 is full, the FIFO buffer 14 has a current data bit stored in each of its latches. The FIFO_Empty signal and FIFO_Full signal are used by the write/read controller 13/15 to generate the write enable signal Wr_En and the read enable signal Rd_En in such a fashion so as to ensure that data is not written when the FIFO buffer 14 is full (so that current bits that have not been read out are not overwritten), and so as to ensure that data is not read out when the FIFO buffer 14 is empty (so that bits that are not current are not read out).

Figure 4:
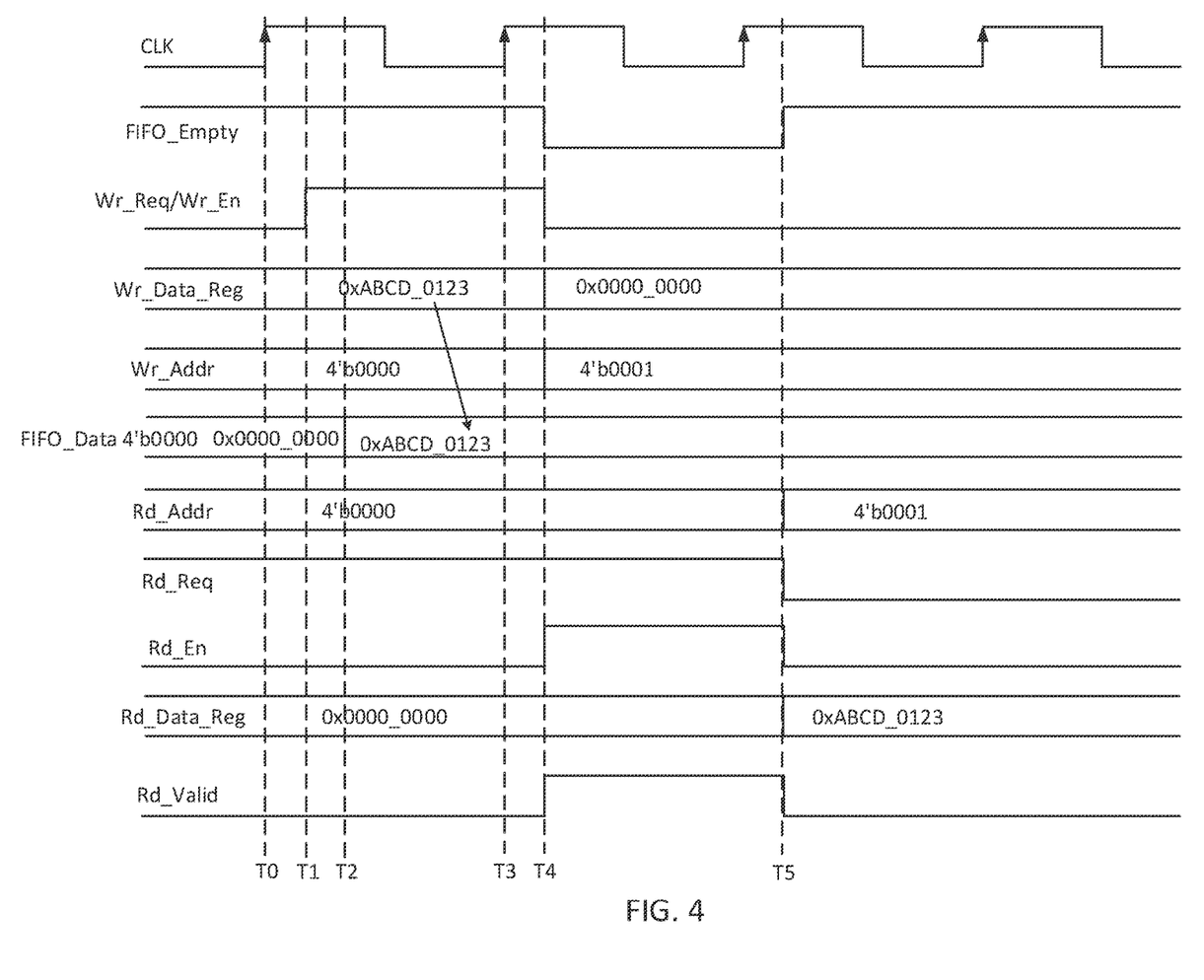
FIG. 4 is a timing diagram showing the states of various signals of FIG. 3 during operation of the FIFO buffer in a non-test mode.

Operation of the FIFO buffer 14 is now described with additional reference to FIG. 4. At an initial time T0 (which is not a startup condition, but is simply a starting point chosen for this description) when the clock CLK goes high, notice that the FIFO buffer 14 is indicated as being empty by the FIFO_Empty signal being a logic 1, that a write has not yet been requested as shown by Wr_Req being a logic 0, that the write enable signal Wr_En is at a logic 0, that the write data register 12(a) contains the data 0xABCD_0123, that the write pointer 12(b) is set to 4'b0000, that the data currently stored in the FIFO buffer 14 is 0x0000_0000, that a read has already been requested as shown by Rd_Req being at a logic 1, that the read enable signal is shown by Rq_En being at a logic 0, that the read data register currently contains the data 0x0000_0000 (the same as that stored in the FIFO buffer 14), and that the read valid signal Rd_Valid is also at a logic 1. At time T1, the write request signal Wr_Req transitions to a logic 1, as does the write enable signal Wr_En since the FIFO_Empty signal is at a logic 1. Therefore, at time T2, since one of the latch banks [$D_{N\text{-}0}$ or $D_{N\text{-}1}$ or $D_{N\text{-}2}$, ..., or $D_{N\text{-}15}$] of the FIFO buffer 14 selected based on the Wr_Addr value (since the write pointer 12(b) is set to 4'b0000, selecting $D_{N\text{-}0}$) has become transparent by assertion of the write enable signal Wr_En, the data 0xABCD_0123 is written to the corresponding latch bank [$D_{N\text{-}0}$] of FIFO buffer 14.

The clock CLK then transitions to a logic 0, and then at time T3, the clock CLK goes high again, so that at time T4, the read enable signal Read_En and read valid signal Rd_Valid go to a logic 1, setting up the read operation. At time t4, the write request Wr_Req and write enable signal Wr_En fall to a logic 0, the write data register 12 is loaded with the next data 12(a) to be written, shown here as 0x0000_0000, the write pointer 12(b) is advanced to 4'b0001, and the FIFO buffer 14 is no longer empty due to the write and therefore the FIFO_empty signal FIFO_Empty falls to a logic 0. By time T5, the read is completed, and thus the read request signal Read_Req falls to a logic 0 and the read data signal Rd_Valid falls to a logic 0. Also as a result of the completion of the read, the read data register 16 holds the read data 16(a) of 0xABCD_0123 just read from the corresponding latch bank [$D_{N\text{-}0}$] of FIFO buffer 14, and the read pointer 16(b) is accordingly advanced to 4'b0001. Due to completion of the read, the FIFO buffer 14 is now empty again, and the FIFO empty signal FIFO_Empty again rises to a logic 1.

Thus, in two clock cycles, a write from the write data register 12 to the FIFO buffer 14, and then a read from the FIFO buffer 14 to the read data register 16, is completed.

The below will describe logic circuitry used for generating control signals for the FIFO buffer 14 when used to perform transition (at-speed) testing. In these particular instances, the FIFO buffer 14 operates based upon an internal write enable signal int_Wr_Enan internal read enable signal int_Rd_En, and an internal read valid signal int_Rd_Valid generated by logic circuitry, as opposed to the direct write enable signal Wr_En, write request signal Wr_Req, read enable signal Rd_En, and read request signal Rd_Req described above.

Logic circuitry for generating the internal write enable signal int_Wr_En, and internal read enable signal int_Rd_En, and an internal read valid signal int_Rd_Valid for use in performing at-speed testing when the clock for at-speed testing is received as the output of a phase locked loop (PLL) is now described with reference to FIGS. 5A-5D.

A first logic circuit 30 is first described with reference to FIG. 5A. The first logic circuit 30 includes a first flip flop 31 and a second flip flop 33 that are both clocked by the clock signal CLK and are both reset by a complement of a reset signal RST_B. The first flip flop 31 receives a scan enable signal Scan_En at its data input, and generates an output that is received by the data input of the flip flop 33. The output of the flip flop 33 produces an internal scan enable signal Internal_Scan_En that is received at an input of an AND gate 35. The AND gate 35 also receives as input the scan enable signal Scan_En through an inverter, and the output of the flip flop 31 through an inverter, and generates a gated scan enable signal Gated_Scan_En as output.

A second logic circuit 40 is now described with reference to FIG. 5B. The second logic circuit 40 includes an AND gate 41 that receives as input the write request signal Wr_Req/write enable signal Wr_En and the gated scan enable signal Gated_Scan_En, and provides output to a first data input of a multiplexer 43. The multiplexer 43 has a second data input that receives a signal from an enable pad, labeled as En_Pin_From_Pad, and has a selection input receiving a transition mode signal Transition_Mode. A multiplexer 45 receives the write request signal Wr_Req/write enable signal Wr_En at its second data input, the output of the multiplexer 43 at its first data input, the scan control signal Scan_Ctrl at its selection input, and produces an internal write enable signal int_Wr_En at its output.

A third logic circuit 50 is now described with reference to FIG. 5C. The third logic circuit 50 includes an AND gate 51 receiving the read valid signal Rd_Valid as a first input, receiving the internal scan enable signal Internal_Scan_En through an inverter as a second input, receiving the scan enable signal Scan_En through an inverter as a third input, and providing output to a multiplexer 53. The multiplexer 53 receives the read valid signal Rd_Valid at a second data input, receives the output of the AND gate 51 at a first data input, receives the transition mode signal Transition_Mode at its selection input, and generates the internal read valid signal int_Rd_Valid at its output.

A fourth logic circuit 60 is now described with reference to FIG. 5D. The fourth logic circuit 60 includes an AND gate 61 receiving the read enable signal Rd_En as a first input, receiving the internal scan enable signal Internal_Scan_En through an inverter as a second input, receiving the scan enable signal Scan_En through an inverter as a third input, and providing output to a multiplexer 63. The multiplexer 63 receives the read enable signal Rd_En at its second data input, the output of the AND gate 61 at its first data input, the transition mode signal Transition_Mode at its selection input, and generates the internal read enable signal int_Rd_En at its output.

The first 30, second 40, third 50, and fourth 60 logic circuits are test glue and MUX logic 98 added over the functional logic part of the write/read controller 13/15.

Operation to perform ATPG testing of the FIFO buffer 14 in transition mode (at-speed testing) when the clock signal CLK is received as the output of a PLL is now described with reference to FIG. 6.

Prior to time T0, the shift phase is performed, during which the scan control signal Scan_Ctrl, transition mode signal Transition_Mode, and scan enable signal Scan_En are at a logic 1.

Capture begins at time T0. At time T0, scan enable signal Scan_En transitions to a logic 0, while the internal scan enable signal Internal_Scan_En remains at a logic 1. The gated scan enable signal Gated_Scan_En is at a logic 1, the internal write enable signal int_Wr_En is at a logic 0, and the internal read enable signal Rd_En and internal read valid signal int_Rd_Valid are at a logic 0. At this point, the logic value of the write request signal Wr_Req, write enable signal Wr_En, read enable signal Rd_En, and valid read signal Rd_Valid can be either at a 1 or a 0 without affecting operation. Also at this point, a forced enable signal from a pad, labeled as En_Pin_From_Pad is forced to a logic 0.

The first capture cycle begins at time T1, with the data 0xABCD_0123 being loaded into the write data register 12, and the write request signal Wr_Req and write enable signal Wr_En rising to a logic 1. Notice that prior to time T0, the scan enable signal Scan_En was at a logic 1. Therefore, referring back to FIG. 5A, when the first rising edge of the clock signal CLK in transition mode occurs at time T1, the flip flop 31 was already holding a logic 1. This means that at time T1, when the flip flop 33 is clocked by the clock signal CLK, the internal scan enable signal Internal_Scan_En is set to a logic 1. Also notice that since scan enable signal Scan_En is at a logic 0 at this point, when the flip flop 31 is clocked by the clock signal CLK at time T1, its output is set to a logic 0. Thus, at time T1, internal scan enable Internal_Scan_En, the complement of scan enable Scan_En, and the complement of the output of the flip flop 31 are all at a logic 1, meaning that the AND gate 35 has received a logic 1 at all inputs, and therefore its output, which is the gated scan enable signal Gated_Scan_En, rises to a logic 1, as reflected in the timing diagram of FIG. 6.

Referring back now to FIG. 5B, notice that at this point, the AND gate 41 will be receiving at its input both the write request signal Wr_Req/Write enable signal Wr_En and the gated scan enable signal Gated_Scan_En, both of which are a logic 1. Therefore, the output of the AND gate 41 will be a logic 1. Since the transition mode signal Transition_Mode is at a logic 1 at this point, the multiplexer 43 selects the output of the AND gate 41 for passage as its output. Likewise, since the scan control signal Scan_Ctrl is at a logic 1 at this point, the multiplexer 45 selects the output of the multiplexer 43 as its output as the internal write enable signal int_Wr_En, as reflected in the timing diagram of FIG. 6.

Since the internal write enable signal int_Wr_En used for operation of the FIFO buffer 14, this means that as per the FIFO operation described above, one of the latch banks [$D_{N-0}$ or $D_{N-1}$ or $D_{N-2}$ ... or $D_{N-15}$] of the FIFO buffer 14 selected based on Wr_Addr value (Wr_Addr being driven from write pointer register 12(*b*) which is part of the scan chain) will become transparent at this point, loading the data 0xABCD_0123 from the write data register 12 into the corresponding latch bank of FIFO buffer 14.

Figure 5A:
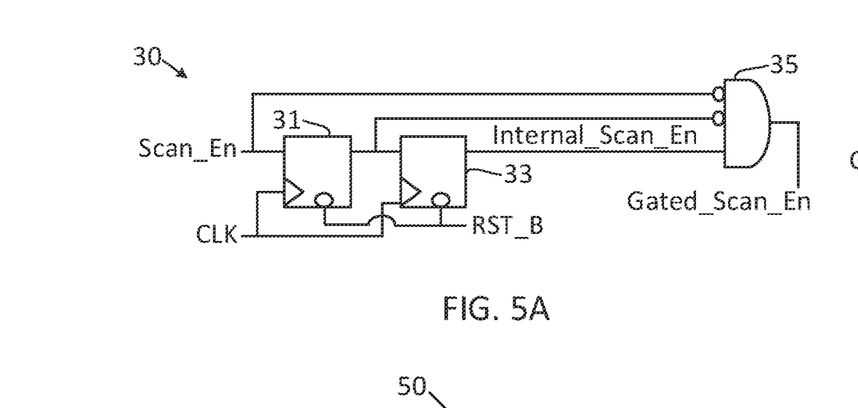
FIGS. 5A-5D are schematic block diagrams of a first embodiment of logic circuitry for generating control signals for operation of the FIFO buffer of FIG. 3 during operation in both non-test and test modes.
Figure 5B:
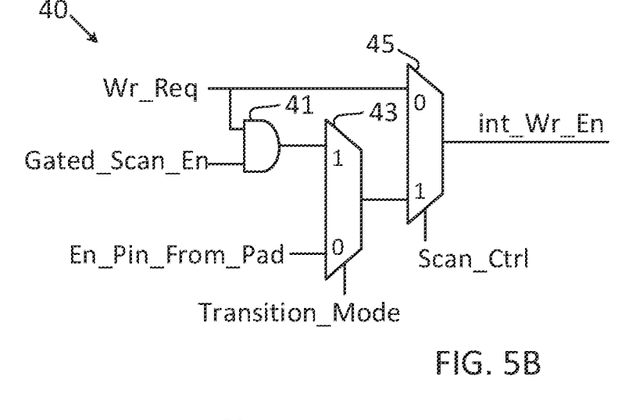
Figure 5C:
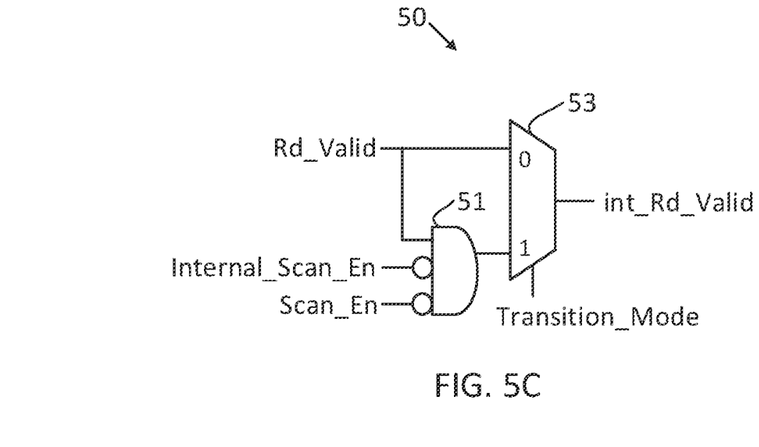
Figure 5D:
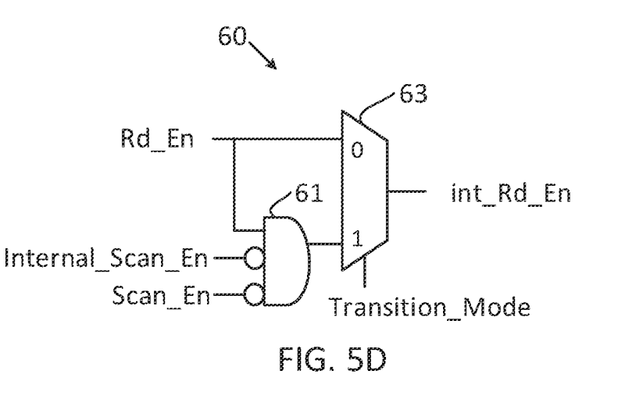
Figure 6:
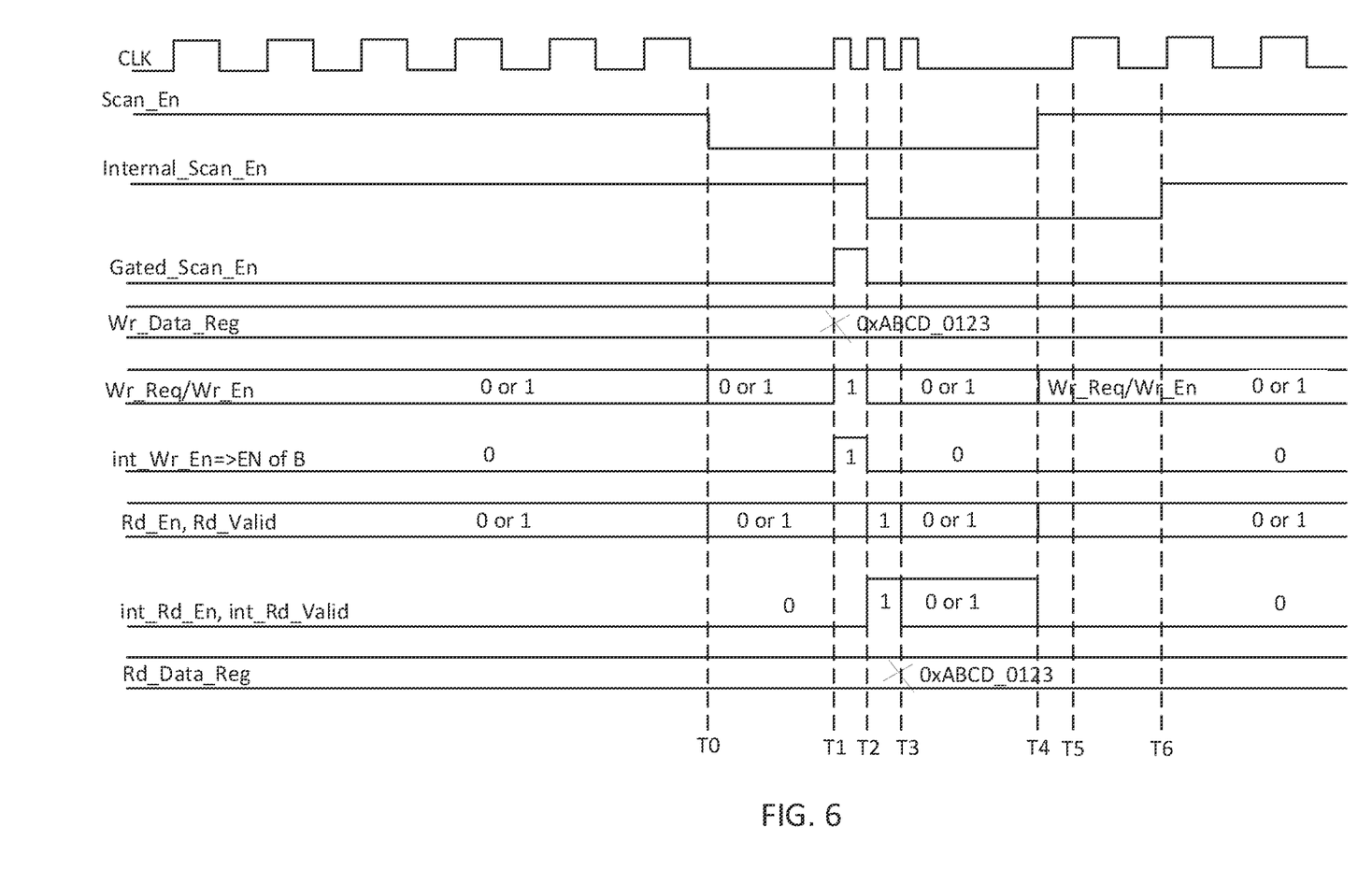
FIG. 6 is a timing diagram showing the states of the various signals of FIGS. 5A-5D during operation of the FIFO buffer to perform transition mode testing in which the clock signal used during testing is provided by a phase locked loop.

At the second rising edge of the clock signal CLK, which occurs at time T2, the flip flop 33 of FIG. 5A passes the logic 0 at its input to its output as the internal scan enable signal Internal_Scan_En, as reflected in the timing diagram of FIG. 6. As a result of the internal scan enable signal Internal_Scan_En going to a logic 0, an input of the AND gate 35 in FIG. 5A is at a logic 0, and therefore the gated scan enable signal Gated_Scan_En falls to a logic 0, as shown in FIG. 6. As a result of the gated scan enable signal Gated_Scan_En falling to a logic 0, one of the inputs to the AND gate 41 of FIG. 5B is a logic 0, meaning that the output of the AND gate 41 falls to a logic 0. Since the transition mode signal Transition_Mode is still at a logic 1, the multiplexer 43 is still selecting the output of the AND gated 41 to pass as output. Since the scan control signal Scan_Ctrl is still at a logic 1, the multiplexer 45 is still passing the output of the multiplexer 43 as its output, with the result being that a logic 0 is now passed as the internal write enable signal int_Wr_En, which is reflected in the timing diagram of FIG. 6.

In addition, the read can now begin due to the completion of the write. Therefore, at time T2 and in response to the second rising edge of the clock signal CLK after entry into transition mode, the read enable signal Rd_En and read valid signal Rd_Valid rise to a logic 1, although if the last shift value was a logic 1, when it was a logic one before T2 as well, as can be seen in FIG. 6. Since the internal scan enable signal Internal_Scan_En falls to a logic 0 at this point, since the scan enable signal Scan_En remains at a logic 0, and since the read valid signal Rd_Valid rises to a logic 1, the AND gate 51 has a logic 1 at each of its inputs, and therefore outputs a logic 1. Since the transition mode signal Transition_Mode is still at a logic 1, the multiplexer 53 therefore still selects the output of the AND gate 51 to pass as the internal read valid signal int_Rd_Valid. As such, at time T2, the internal read valid signal int_Rd_Valid rises to a logic 1, as shown in the timing diagram of FIG. 6.

Also since the internal scan enable signal Internal_Scan_En falls to a logic 0 at this point, the scan enable signal Scan_En remains at a logic 0, and the read enable signal Rd_En rises to a logic 1, the AND gate 61 has a logic 1 at each of its inputs, and therefore outputs a logic 1. Since the transition mode signal Transition_Mode is still at a logic 1, the multiplexer 63 therefore still selects the output of the AND gate 61 to pass as the internal read enable signal int_Rd_En. As such, at time T2, the internal read enable signal int_Rd_En rises to a logic 1, as shown in the timing diagram of FIG. 6.

At the third rising edge of the clock signal CLK (i.e., at the end of the period of the clock signal CLK that begun at the previous rising edge thereof), which occurs at time T3, the the data 0xABCD_0123 written earlier into the latch bank of FIFO buffer 14 read from the corresponding latch bank of FIFO buffer 14 when selected based on the Rd_Addr value (Rd_Addr being driven from read pointer register

16(*b*), which is part of scan chain) to the read data register 16 completes. Thus, the data 0xABCD_0123 has been written from the write data register 12 to a latch bank [$D_{N\text{-}0}$ or $D_{N\text{-}1}$ or $D_{N\text{-}2}$, . . . , or $D_{N\text{-}15}$] of FIFO buffer 14, and has been read from the same latch bank [$D_{N\text{-}0}$ or $D_{N\text{-}1}$ or $D_{N\text{-}2}$, . . . , or $D_{N\text{-}15}$] of FIFO buffer 14 by the read data register 16, in two clock cycles.

In some instances, the read valid signal Rd_Valid and read enable signal Rd_En may fall to a logic 0 at time T3. In this case, since the read valid signal Rd_Valid is at a logic 0, and the output of the AND gate 51 therefore falls to a logic 0, and the internal read valid signal int_Rd_Valid at the output of the multiplexer 53 will then go to a logic 0; likewise, since the read enable signal Rd_En is at a logic 0, and the output of the AND gate 61 therefore falls to a logic 0, and the internal read enable signal int_Rd_En at the output of the multiplexer 63 will then go to a logic 0. In the case where the read valid signal Rd_Valid and read enable signal Rd_En remain at a logic 1 at time T3, the internal read valid signal int_Rd_Valid and internal read enable signal int_Rd_En remain at a logic 1.

At time T4, the scan enable signal Scan_En rises to a logic 1, indicating the end of transition mode testing. As a result of the scan enable signal Scan_En rising to a logic 1, the output of the AND gate 51 falls to a logic 0, and the internal read valid signal int_Rd_Valid at the output of the multiplexer 53 will then go to a logic 0; likewise, the output of the AND gate 61 will also fall to a logic 0, and the internal read enable signal int_Rd_En at the output of the multiplexer 63 will then go to a logic 0. This is reflected in the timing diagram of FIG. 6.

At time T5, the next rising edge of the clock signal CLK arrives, clocking the flip flops 31 and 33 so that the logic 1 of the scan enable signal Scan_En is passed to the output of the flip flop 31. At time T6, the next rising edge of the clock signal CLK arrives, and the flip flops 31 and 33 are again clocked. Thus, at time T6, the logic 1 output of the flip flop 31 is passed by flip flop 33 as the internal scan enable signal Internal_Scan_En, as shown in the timing diagram of FIG. 6.

From the above description, notice that the clock signal CLK used during the at-speed testing is higher in frequency than it otherwise is.

Figure 7A:
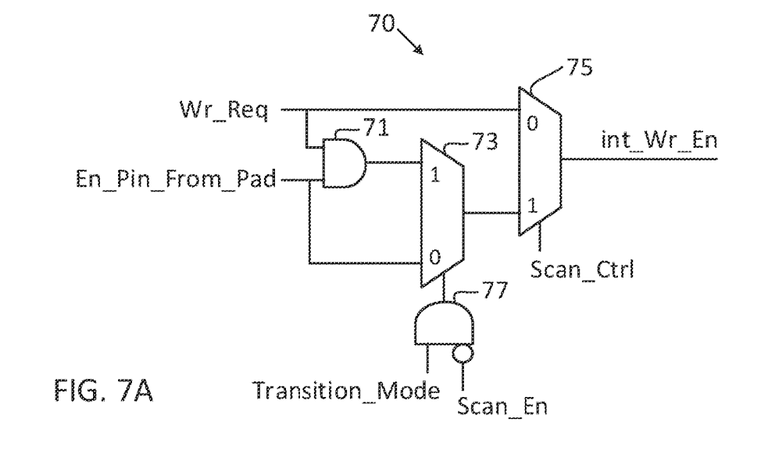
FIGS. 7A-7C are schematic block diagrams of a second embodiment of logic circuitry for generating control signals for operation of the FIFO buffer of FIG. 3 during operation in both non-test and test modes.
Figure 7B:
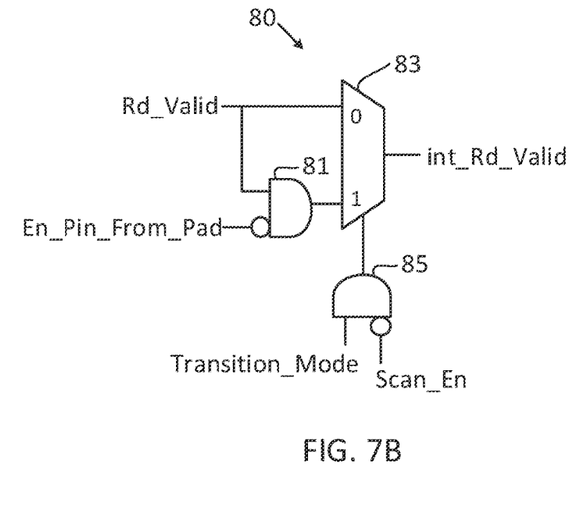
Figure 7C:
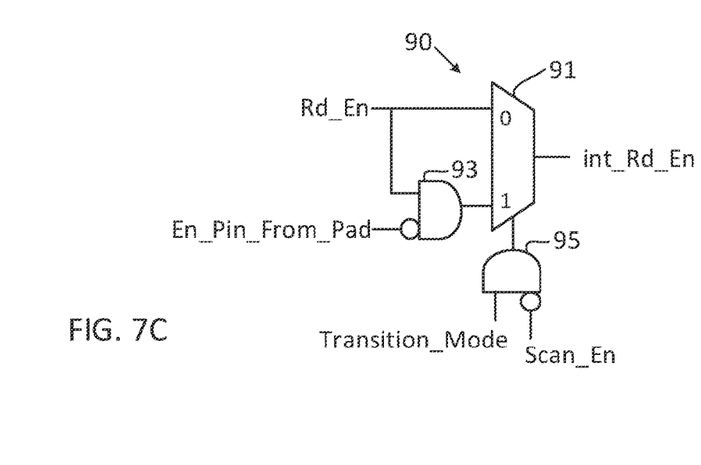

Logic circuitry for generating an internal write enable signal int_Wr_En, an internal read enable signal int_Rd_En, and an internal read valid signal int_Rd_Valid for use in performing transition testing at lower frequency where the clock for transition testing at low frequency is received from a pad is now described with reference to FIGS. 7A-7C. Transition testing performed using the clock received from a pad is due to limitations of the ATE or pad; thus, while this is transition testing, it is not at-speed high frequency testing.

A fifth logic circuit 70 is now described with reference to FIG. 7A. The fifth logic circuit 70 includes a first AND gate 71 receiving the write request signal Wr_Req/Write enable signal Wr_En and the signal from an enable pad, labeled as En_Pin_From_Pad. A first multiplexer 73 receives the output of the AND gate 71 at a first input, En_Pin_From_Pad at a second input, the output of AND gate 77 at a selection input, and provides output to multiplexer 75. The AND gate 77 receives the transition mode signal Transition_Mode at a first input and the scan enable signal Scan_En through an inverter at a second input, and provides output to the selection input of the multiplexer 73. The multiplexer 75 has a second input receiving the write request signal Wr_Req/Write enable signal Wr_En, a first input receiving the output of the multiplexer 73, a selection input receiving the scan control signal Scan_Ctrl, and an output generating the internal write enable signal int_Wr_En.

A sixth logic circuit 80 is now described with reference to FIG. 7B. The sixth logic circuit 80 includes an AND gate 81 receiving as input the read valid signal Rd_Valid and En_Pin_From_Pad through an inverter, and providing output to a multiplexer 83. The multiplexer 83 receives the read valid signal Rd_Valid at its second input, the output of the AND gate 81 at its first input, the output of AND gate 85 at its selection input, and generates the internal read valid signal int_Rd_Valid at its output. The AND gate 85 receives the transition mode signal Transition_Mode at a first input and the scan enable signal Scan_En through an inverter at a second input, and provides output to the selection input of the multiplexer 83.

A seventh logic circuit 90 is now described with reference to FIG. 7C. The seventh logic circuit 90 includes an AND gate 93 receiving as input the read enable signal Rd_En and En_Pin_From_Pad through an inverter, and providing output to a multiplexer 91. The multiplexer 91 receives the read enable signal Rd_En at its second input, the output of the AND gate 93 at its first input, the output of AND gate 95 at its selection input, and generates the internal read enable signal int_Rd_En at its output. The AND gate 95 receives the transition mode signal Transition_Mode at a first input and the scan enable signal Scan_En through an inverter at a second input, and provides output to the selection input of the multiplexer 91.

Figure 8:
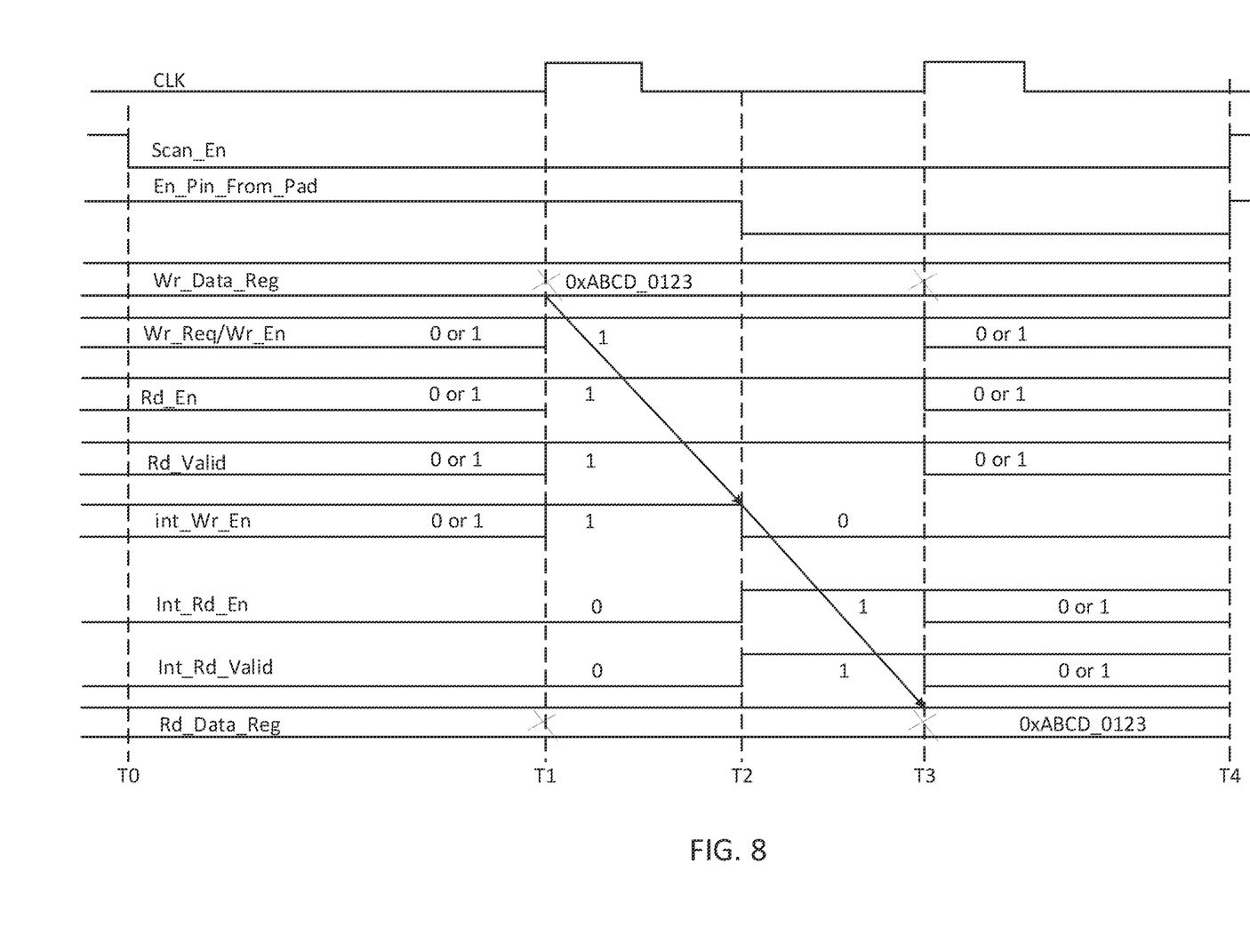
FIG. 8 is a timing diagram showing the states of the various signals of FIGS. 7A-7D during operation of the FIFO buffer to perform transition mode testing in which the clock signal used during testing is provided at a pad by an external source.

Operation to perform ATPG testing of the FIFO buffer 14 in transition mode (at low frequency) when the clock signal CLK is received from a pad is now described with reference to FIG. 8. Prior to time T0, shifting is performed, during which the scan control signal Scan_Ctrl, transition mode signal Transition_Mode, and scan enable signal Scan_En are at a logic 1.

At time T0, the scan enable signal Scan_En is set to a logic 0, beginning capture mode. Notice that at this point, En_Pin_From_Pad is at a logic 1.

At time T1, the write request signal Wr_Req and write enable signal Write_En rise to a logic 1, as do the read valid signal Rd_Valid and read enable signal Rd_En. Referring back to FIG. 7A, the transition mode signal Transition_Mode being a logic 1 and the scan enable signal Scan_En being at a logic 0 mean that that the AND gate 77 has a logic 1 at both inputs, and therefore causes the multiplexer 73 to select its first input to pass as output. Since the AND gate 71 receives the write request signal Wr_Req and En_Pin_From_Pad, both of which are a logic 1 at this point, the output of the AND gate 71 is therefore passed by the multiplexer 73 as its output. Since the scan control signal Scan_Ctrl is at a logic 1 at this point, the multiplexer 75 passes the output of the multiplexer 73 as output, and therefore the internal write enable signal int_Wr_En are set to a logic 1 at time T1 as may be observed in FIG. 8. This permits the data 0xABCD_0123 in the write data register 12 at this point to be written to the one of the latch banks [$D_{N\text{-}0}$ or $D_{N\text{-}1}$ or $D_{N\text{-}2}$, . . . , or $D_{N\text{-}15}$] of FIFO buffer 14 selected based on Wr_Addr value (Wr_Addr being driven from write pointer register 12(*b*) which is part of scan chain).

At time T2, the write of the data to the FIFO buffer 14 has been completed, and Ein_Pin_From_Pad falls to a logic 0. Since Ein_Pin_From_Pad is a logic 0 at this point, the output of the AND gate 71 changes to a logic 0, with the result being that the internal write enable signal int_Wr_En fall to a logic 0, as may be observed in the timing diagram of FIG. 8, concluding the write.

Referring back to FIG. 7B, the transition mode signal Transition_Mode being a logic 1 and the scan enable signal Scan_En being at a logic 0 mean that that the AND gate 85 has a logic 1 at both inputs, and therefore causes the multiplexer 83 to select its first input to pass as output. Since the read valid signal Rd_Valid is a logic 1 at this point and Ein_Pin_From_Pad has fallen to a logic 0, the AND gate 81 has a logic 1 at both of its inputs, and therefore outputs a logic 1, which is passed by the multiplexer 83 as the internal read valid signal int_Rd_Valid, as may be observed in FIG. 8. Referring back to FIG. 7C, the transition mode signal Transition_Mode being a logic 1 and the scan enable signal Scan_En being at a logic 0 likewise mean that that the AND gate 95 has a logic 1 at both inputs, and therefore causes the multiplexer 91 to select its first input to pass as output. Since the read enable signal Rd_En is a logic 1 at this point and Ein_Pin_From_Pad has fallen to a logic 0, the AND gate 93 has a logic 1 at both of its inputs, and therefore outputs a logic 1, which is passed by the multiplexer 91 as the internal read enable signal int_Rd_En, as may be observed in FIG. 8.

This sets up the read, which is completed at T3, and so the data 0xABCD_0123 written earlier into the latch bank of FIFO buffer 14 read from the corresponding latch bank of FIFO buffer 14 when selected based on Rd_Addr value (Rd_Addr being driven from read pointer register 16(*b*), which is part of scan chain) to the read data register 16 is seen at this point. At time T4. The scan enable signal Scan_En rises to a logic 1 to end transition mode testing.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A system, comprising:
a write data register configured to store data to be written;
a read data register configured to store data read thereinto;
a first-in-first-out (FIFO) buffer comprised of banks of latches, wherein the banks of latches are arranged to store multiple words, with one word at a time being selectable by a write address signal for having the data from the write data register written thereinto, and with one word at a time being selectable by a read address signal for having data stored therein read out into the read data register;
control circuitry configured to receive a read request signal and the read address signal, and to generate a read enable signal; and
glue logic configured to generate an internal write enable signal from at least a write enable signal and to generate an internal read enable signal from at least the read enable signal;
wherein, when the system is in a functional mode, the banks of latches of the FIFO buffer are enabled by the write enable signal and the read enable signal; and
wherein, when the system is in a test mode, the banks of latches of the FIFO buffer are enabled by the internal write enable signal and the internal read enable signal.

2. The system of claim 1, wherein the control circuitry and glue logic cooperate to operate the system in the test mode when the test mode is an automated test pattern generation (ATPG) test mode by:
beginning stuck-at testing; and
performing a test setup phase to initialize the FIFO buffer for ATPG test mode by:
setting a scan reset signal to a logic 0 to thereby place the write data register and the read data register into a reset state;
enabling the banks of latches of the FIFO buffer using an external enable signal to thereby make the banks of latches transparent;
removing the external enable signal to thereby cause the banks of latches to latch; and
setting the scan reset signal to a logic 1 to thereby release the write data register and the read data register from the reset state, while not supplying a clock signal to the write data register, thereby completing the test setup phase.

3. The system of claim 2, wherein the control circuitry and glue logic further cooperate to operate the system in the test mode when the test mode is the ATPG test mode by:
performing a shift phase by shifting an ATPG test pattern into the FIFO buffer such that, after a last shift, the write data register holds a value of a last bit to be shifted in; and
performing a capture phase, wherein, when the FIFO buffer is experiencing a stuck-at-1 fault at an enable input of one or more of the banks of latches, the read data register holds the value of the last bit to be shifted in, but when the FIFO buffer is not experiencing the stuck-at-1 fault at the enable input of one or more of the banks of latches, the read data register holds a logic 0.

4. The system of claim 1, wherein the control circuitry and glue logic cooperate to operate the system in the test mode when the test mode is a logic built in self test (LBIST) mode by:
enabling the banks of latches of the FIFO buffer using an enable signal to thereby cause the banks of latches to become transparent;
generating a LBIST pattern and passing the LBIST pattern through the FIFO buffer; and
after a given number of bits of the LBIST pattern have passed through the FIFO buffer, deasserting the enable signal.

5. The system of claim 1, wherein the control circuitry and glue logic cooperate to operate the system in the test mode when the test mode is a logic built in self test (LBIST) mode by:
enabling the banks of latches of the FIFO buffer using an enable signal;
generating a LBIST pattern and passing the LBIST pattern through the FIFO buffer; and
after a given number of bits of the LBIST pattern have passed through the FIFO buffer, deasserting the enable signal.

6. The system of claim 1, wherein the write data register and read data register are clocked by a clock signal; and wherein, when the control circuitry and glue logic cooperate to operate the system in the test mode when the test mode is an automated test pattern generation (ATPG) mode, the clock signal is supplied by a phase locked loop.

7. The system of claim 1, wherein the write data register and read data register are clocked by a clock signal; wherein, when the control circuitry and glue logic cooperate to operate the system in the test mode when the test mode is an automated test pattern generation (ATPG) mode, the clock signal is externally supplied.

8. A system, comprising:
a write data register clocked by a clock signal;
a read data register clocked by the clock signal;
a first-in-first-out (FIFO) buffer coupled between the write data register and read data register, the FIFO buffer comprised of banks of latches that are enabled by a read enable signal and a write enable signal, accessed for reading by a read address signal, and accessed for writing by a write address signal; and
glue logic configured to generate an internal write enable signal from at least the write enable signal and to generate an internal read enable signal from at least the read enable signal.

9. The system of claim 8, wherein the glue logic comprises a first glue logic circuit, the first glue logic circuit comprising:
a first flip flop having a data input receiving a scan enable signal, an output, and a clock input receiving the clock signal;
a second flip flop having a data input receiving the output of the first flip flop, an output at which an internal scan enable signal is generated, and a clock input receiving the clock signal; and
an AND gate having a first inverting input receiving the scan enable signal, a second inverting input receiving the output of the first flip flop, and a third non-inverting input receiving the internal scan enable signal, wherein the AND gate generates a gated scan enable signal at its output.

10. The system of claim 8, wherein the glue logic comprises a second glue logic circuit, the second glue logic circuit comprising:
an AND gate having a first input receiving a write request signal and a second input receiving a gated scan enable signal, and having an output;
a first multiplexer having a first data input receiving a pad enable signal, a second data input receiving the output of the AND gate, a selection input receiving a transition mode signal, and an output; and
a second multiplexer having a first data input receiving the write request signal, a second data input receiving the output of the first multiplexer, a selection input receiving a scan control signal, and an output at which the internal write enable signal is generated.

11. The system of claim 8, wherein the glue logic comprises a third glue logic circuit, the third glue logic circuit comprising:
an AND gate having a first non-inverting input receiving a read valid signal, a second inverting input receiving an internal scan enable signal, a third inverting input receiving a scan enable signal, and an output; and
a multiplexer having a first data input receiving the read valid signal, a second data input receiving the output of the AND gate of the third glue logic circuit, a selection input receiving a transition mode signal, and an output at which an internal read valid signal is generated.

12. The system of claim 8, wherein the glue logic comprises a fourth glue logic circuit, the fourth glue logic circuit comprising:
an AND gate having a first non-inverting input receiving the read enable signal, a second inverting input receiving an internal scan enable signal, a third inverting input receiving a scan enable signal, and an output; and
a multiplexer having a first data input receiving the read enable signal, a second data input receiving the output of the AND gate of the fourth glue logic circuit, a selection input receiving a transition mode signal, and an output at which the internal read enable signal is generated.

13. The system of claim 8, wherein the glue logic comprises a fifth glue logic circuit, the fifth glue logic circuit comprising:
a first AND gate having a first input receiving a write request signal, a second input receiving a pad enable signal, and an output;
a second AND gate having a first non-inverting input receiving a transition mode signal, a second inverting input receiving a scan enable signal, and an output;
a first multiplexer having a first data input receiving the pad enable signal, a second data input receiving the output of the first AND gate, a selection input receiving the output of the second AND gate, and an output; and
a second multiplexer having a first data input receiving the write request signal, a second data input receiving the output of the first multiplexer, a selection input receiving a scan control signal, and an output at which the internal write enable signal is generated.

14. The system of claim 8, wherein the glue logic comprises a sixth logic circuit, the sixth logic circuit comprising:
a first AND gate having a first non-inverting input receiving a read valid signal, a second inverting input receiving a pad enable signal, and an output;
a second AND gate having a first non-inverting input receiving a transition mode signal, a second inverting input receiving a scan enable signal, and an output; and
a multiplexer having a first data input receiving the read valid signal, a second data input receiving the output from the first AND gate, a selection input receiving the output of the second AND gate, and an output at which an internal read valid signal is generated.

15. The system of claim 8, wherein the glue logic comprises a seventh logic circuit, the seventh logic circuit comprising:
a first AND gate having a first non-inverting input receiving a read enable signal, a second inverting input receiving a pad enable signal, and an output;
a second AND gate having a first non-inverting input receiving a transition mode signal, a second inverting input receiving a scan enable signal, and an output; and
a multiplexer having a first data input receiving the read enable signal, a second data input receiving the output from the first AND gate of the seventh logic circuit, a selection input receiving the output of the second AND gate of the seventh logic circuit, and an output at which the internal read enable signal is generated.

16. A method of operating a system in a test mode, the method comprising:
when the test mode is an automated test pattern generation (ATPG) test mode:
beginning stuck-at testing by setting a scan control signal to a logic one and setting a transition mode signal to a logic 0; and
initializing a first-in-first-out (FIFO) buffer for ATPG test mode by:
setting a scan reset signal to a logic 0 to thereby place a write data register and a read data register associated with the FIFO buffer into a reset state;
enabling latches of the FIFO buffer using an external enable signal;

removing the external enable signal to thereby cause the latches to latch; and setting the scan reset signal to a logic 1 to thereby release the write data register and the read data register from the reset state, while not clocking the write data register.

17. The method of claim 16, the method further comprising, when the test mode is the ATPG test mode:

performing a shift phase by shifting an ATPG test pattern into the FIFO buffer such that, after a last shift, the write data register holds a value of a last bit to be shifted in; and performing a capture phase, wherein, when the FIFO buffer is experiencing a stuck-at-1 fault at an enable input of one or more of the latches, the read data register holds the value of the last bit to be shifted in, but when the FIFO buffer is not experiencing the stuck-at-1 fault at the enable input of one or more of the latches, the read data register holds a logic 0.

18. The method of claim 17, wherein when the FIFO buffer is experiencing a stuck-at-1 fault at an enable input of one or more of the latches, the FIFO buffer contains the value of the last bit to be shifted in, but when the FIFO buffer is not experiencing the stuck-at-1 fault at the enable input of one or more of the latches, the FIFO buffer at this point does not contain the value of the last bit to be shifted in.

19. The method of claim 16, further comprising when the test mode is a logic built in self test (LBIST) mode:

enabling the latches of the FIFO buffer using an enable signal to thereby cause the latches to become transparent; and generating a LBIST pattern and passing the LBIST pattern through the FIFO buffer.

20. The method of claim 19, wherein after a given number of bits of the LBIST pattern have passed through the FIFO buffer, deasserting the enable signal such that, when the FIFO buffer is experiencing a stuck-at-1 fault at an enable input of one or more of the latches, the FIFO buffer continues to pass the LBIST pattern, but when the FIFO buffer is not experiencing the stuck-at-1 fault at an enable input of one or more of the latches, the FIFO buffer ceases passing the LBIST pattern.

* * * * *